United States Patent
Yoshida et al.

(10) Patent No.: US 11,187,979 B2
(45) Date of Patent: Nov. 30, 2021

(54) IMPRINT APPARATUS, IMPRINT METHOD, AND ARTICLE MANUFACTURING METHOD

(71) Applicant: CANON KABUSHIKI KAISHA, Tokyo (JP)

(72) Inventors: Setsuo Yoshida, Saitama (JP); Noriyasu Hasegawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 279 days.

(21) Appl. No.: 16/391,679

(22) Filed: Apr. 23, 2019

(65) Prior Publication Data

US 2019/0250507 A1    Aug. 15, 2019

Related U.S. Application Data

(63) Continuation of application No. PCT/JP2017/034872, filed on Sep. 27, 2017.

(30) Foreign Application Priority Data

Nov. 11, 2016    (JP) .............................. JP2016-220927

(51) Int. Cl.
*G03F 7/00* (2006.01)
*B29C 59/02* (2006.01)
(Continued)

(52) U.S. Cl.
CPC ............ *G03F 7/0002* (2013.01); *B29C 59/02* (2013.01); *G03F 9/703* (2013.01); *H01L 21/027* (2013.01)

(58) Field of Classification Search
CPC ........ G03F 7/0002; G03F 9/703; G03F 7/168; G03F 7/70708; B29C 59/02; H01L 21/027; H01L 21/6838
See application file for complete search history.

(56) References Cited

U.S. PATENT DOCUMENTS 7,635,445 B2    12/2009    Choi et al.
7,636,999 B2    12/2009    Choi et al.
(Continued)

FOREIGN PATENT DOCUMENTS

CN    101142743 A    3/2008
CN    104094380 A    10/2014
(Continued)

OTHER PUBLICATIONS

Office Action issued in Japanese Appln. No. 2016-220927 dated Jun. 29, 2020.
(Continued)

*Primary Examiner* — Deoram Persaud
(74) *Attorney, Agent, or Firm* — Rossi, Kimms & McDowell LLP (57) ABSTRACT

An imprint apparatus comprises a mold holder configured to move while holding the mold, and a substrate holder including a plurality of suction regions for chucking the substrate and configured to move while holding the substrate. When performing the mold separation, among the plurality of suction regions, a suction force of a suction region at a position where the mold is to be separated from the imprint material is made weaker than a suction force of a suction region on a peripheral side of the substrate than the position where the mold is to be separated, and the mold holder is tilted after at least one of the mold holder and the substrate holder is moved by a predetermined amount so as to widen a gap between the mold and the substrate.

14 Claims, 8 Drawing Sheets

(51) Int. Cl.
  *G03F 9/00* (2006.01)
  *H01L 21/027* (2006.01)

(56) References Cited

U.S. PATENT DOCUMENTS

| | | | |
|---|---|---|---|
| 9,798,231 | B2 | 10/2017 | Shiode |
| 10,197,911 | B2 | 2/2019 | Kimura |
| 10,335,984 | B2 | 7/2019 | Choi |
| 10,739,674 | B2* | 8/2020 | Kondo ................ G03F 7/0002 |
| 10,870,225 | B2* | 12/2020 | Harayama ............ G03F 7/0002 |
| 2006/0172031 | A1 | 8/2006 | Babbs et al. |
| 2007/0114686 | A1 | 5/2007 | Choi et al. |
| 2010/0072652 | A1* | 3/2010 | GanapathiSubramanian ............ B82Y 10/00 264/101 |
| 2010/0102469 | A1 | 4/2010 | Khusnatdinov et al. |
| 2013/0056905 | A1* | 3/2013 | Hamaya ................ B82Y 10/00 264/293 |
| 2013/0113136 | A1 | 5/2013 | Arai |
| 2016/0046065 | A1* | 2/2016 | Takarada ............. G03F 7/0002 264/494 |
| 2016/0297136 | A1* | 10/2016 | Wakabayashi .......... B29C 64/20 |
| 2017/0165898 | A1* | 6/2017 | Meissl .................. B29C 35/02 |
| 2017/0274418 | A1* | 9/2017 | Shiode ................. B05D 3/007 |
| 2019/0310547 | A1* | 10/2019 | Kondo ................. G03F 7/0002 |
| 2019/0317397 | A1* | 10/2019 | Sato ...................... G03F 7/0002 |
| 2020/0387067 | A1* | 12/2020 | Sato ...................... G03F 7/0002 |

FOREIGN PATENT DOCUMENTS

| | | |
|---|---|---|
| JP | 2007083626 A | 4/2007 |
| JP | 2008529826 A | 8/2008 |
| JP | 2011100952 A | 5/2011 |
| JP | 2012134214 A | 7/2012 |
| JP | 2013098497 A | 5/2013 |
| JP | 2013162045 A | 8/2013 |
| JP | 2015012033 A | 1/2015 |
| JP | 2015111683 A | 6/2015 |
| JP | 2015138842 A | 7/2015 |
| JP | 2015201556 A | 11/2015 |

OTHER PUBLICATIONS

Written Opinion issued in Intl. Appln. No. PCT/JP2017/034872 dated Dec. 26, 2017.
International Search Report issued in Intl. Appln. No PCT/JP2017/034872 dated Dec. 26, 2017. English translation provided.
Office Action issued in Taiwanese Appln. No. 106133991 dated Jul. 10, 2018. English translation provided.

* cited by examiner

IMPRINT APPARATUS, IMPRINT METHOD, AND ARTICLE MANUFACTURING METHOD

CROSS-REFERENCE TO RELATED APPLICATIONS

This application is a Continuation of International Patent Application No. PCT/JP2017/034872, filed Sep. 27, 2017, which claims the benefit of Japanese Patent Application No. 2016-220927, filed Nov. 11, 2016, both of which are hereby incorporated by reference herein in their entirety.

BACKGROUND OF THE INVENTION

Field of the Invention

The present invention relates to an imprint apparatus, an imprint method, and an article manufacturing method.

Background Art

In an imprint apparatus, when mold separation is performed to separate a mold from an imprint material that has been cured on a substrate, a large separation stress is applied instantaneously to the interface (contact portion) between the mold and the cured imprint material. It is known that this stress may distort the pattern to be formed and lead to a pattern defect.

In PTL 1, a mold is temporarily deformed into a convex shape toward a substrate, and the mold is gradually separated from the periphery of a pattern formation portion of the imprint material to avoid an abrupt generation of stress at the time of mold separation. However, in a case in which a finer pattern is to be formed, pattern distortion cannot be suppressed by this technique alone, and thus it is difficult to reduce the generation of defects. Hence, in PTL 2 and PTL 3, the suction pressure of a chuck which is a substrate holder is weakened to cause a part of a substrate to rise from the chuck when the mold is to be separated at the time of mold separation. This can reduce the stress generated on the interface between the mold and the cured imprint material, and the defects due to pattern distortion can be reduced.

CITATION LIST

Patent Literature

PTL 1: US-2007-0114686
PTL 2: US-2006-0172031
PTL 3: US-2010-0102469

Figure 7:
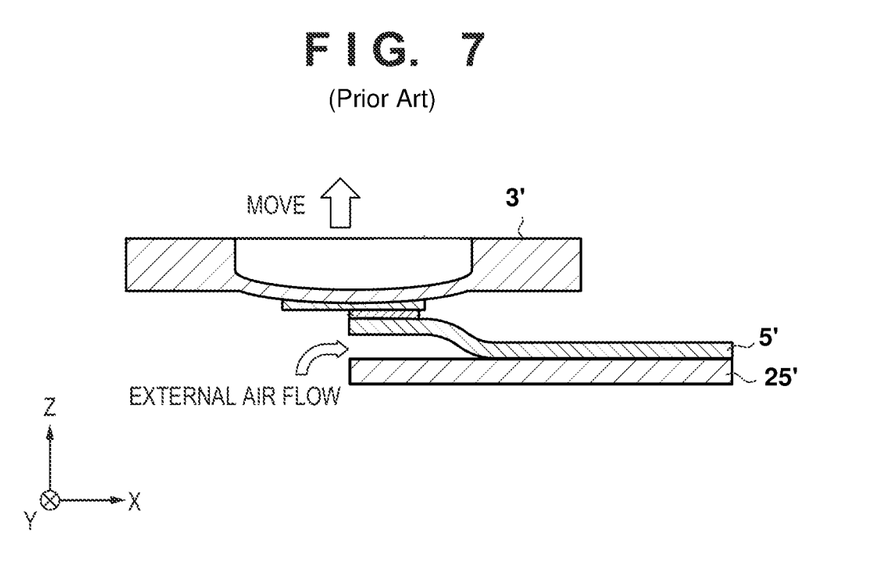
FIG. 7 is a view for explaining a problem of a related art.

In a case in which a shot region is positioned near the periphery of a substrate 5', the substrate holding force will weaken when the substrate 5' rises from a substrate chuck 25' since outside air will flow into a substrate suction portion due to the formation of a gap between the substrate 5' and the substrate chuck 25' at the periphery of the substrate 5', as shown in FIG. 7. If the substrate holding force weakens, it will reduce the substrate holding force of the substrate chuck 25', and this may cause the substrate 5' to fall off from the substrate chuck 25'. If the substrate 5' falls off from the substrate chuck 25', the production process will need to be stopped to separate a mold 3' from the substrate 5' and to execute a recovery process. Therefore, the productivity will be reduced by the long downtime generated by this phenomenon. However, defects caused by pattern distortion will increase if the operation to reduce the substrate suction pressure at the time of mold separation is not performed to prevent the substrate 5' from falling off the substrate chuck 25'.

SUMMARY OF THE INVENTION

The present invention provides a technique advantageous in, for example, suppressing pattern distortion and defects and preventing a substrate from falling off from a substrate holder.

According to one aspect of the present invention, there is provided an imprint apparatus that performs an imprint process which includes bringing a mold and an imprint material on a substrate into contact with each other, curing the imprint material, and performing mold separation of separating the mold from the cured imprint material, characterized by comprising: a mold holder configured to move while holding the mold; and a substrate holder including a plurality of suction regions for chucking the substrate and configured to move while holding the substrate, wherein when performing the mold separation, among the plurality of suction regions, a suction force of a suction region at a position where the mold is to be separated from the imprint material is made weaker than a suction force of a suction region on a peripheral side of the substrate than the position where the mold is to be separated, and the mold holder is tilted after at least one of the mold holder and the substrate holder is moved by a predetermined amount so as to widen a gap between the mold and the substrate.

Further features of the present invention will become apparent from the following description of exemplary embodiments (with reference to the attached drawings).

DESCRIPTION OF THE EMBODIMENTS

Embodiments of the present invention will be described in detail below with reference to the accompanying drawings. Note that the following embodiments are merely specific examples of the embodiments of the present invention, and do not limit the present invention. In addition, not all combinations of characteristic features described in the following embodiments are essential to the solution of the problem in the present invention.

First Embodiment

The outline of an imprint apparatus according to an embodiment will be described first. The imprint apparatus is an apparatus that brings an imprint material supplied on a substrate into contact with a mold and applies curing energy on the imprint material to form a pattern of a cured product onto which a concave-convex pattern of the mold has been transferred.

As an imprint material, a curable composition (to be also referred to a resin in an uncured state) to be cured by receiving the curing energy is used. Examples of the curing energy are an electromagnetic wave, heat, and the like. The electromagnetic wave is, for example, light selected from the wavelength range of 10 nm (inclusive) to 1 mm (inclusive). Examples of the electromagnetic wave can be infrared light, a visible light beam, and ultraviolet light. The curable composition can be a composition cured with light irradiation or heating. Among these compositions, the photo-curable composition cured by light irradiation contains at least a polymerizable composition and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or film obtained by connecting a plurality of droplets supplied by the imprint material supplier. The viscosity (the viscosity at 25° C.) of the imprint material is, for example, 1 mPa·s (inclusive) to 100 mPa·s (inclusive). Examples of the substrate material can be glass, a ceramic, a metal, a semiconductor, a resin, and the like. A member made of a material different from the substrate may be formed on the surface of the substrate, as needed. Examples of the substrate are a silicon wafer, a compound semiconductor wafer, and silica glass.

Figure 1:
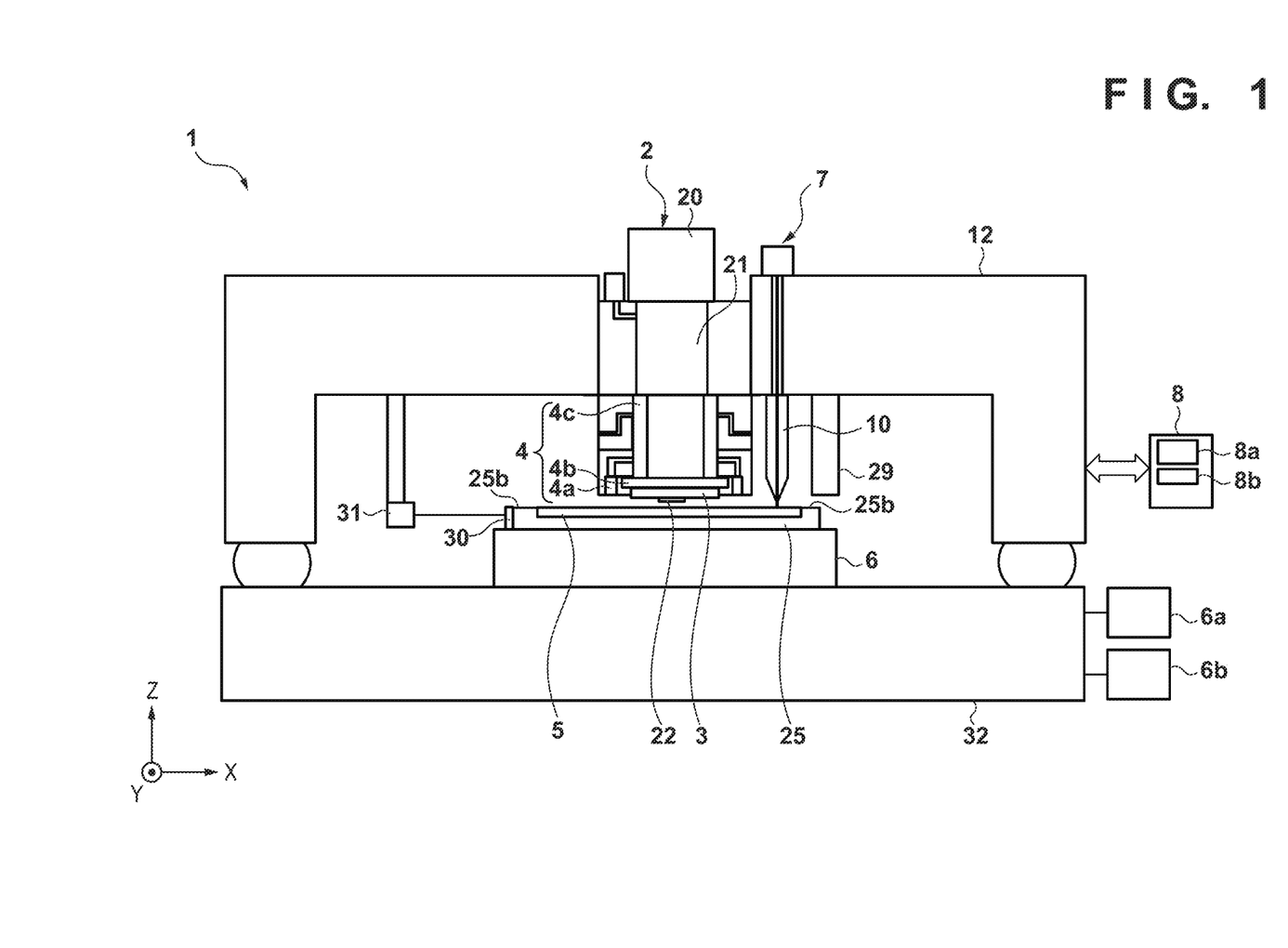
FIG. 1 is a view showing the arrangement of an imprint apparatus according to an embodiment.

FIG. 1 is a view showing the arrangement of an imprint apparatus 1 according to the embodiment. In this embodiment, the imprint apparatus 1 adopts a photo-curing method of curing an imprint material by ultraviolet irradiation. However, the present invention is not limited to this, and a heat-curing method of curing an imprint material by application of heat can be adopted. Note that in the following drawings, a Z-axis in an X-Y-Z coordinate system is set in a direction parallel to the irradiation axis of ultraviolet light with respect to the mold, and an X-axis and a Y-axis are set in directions perpendicular to each other in a plane perpendicular to the Z-axis.

The imprint apparatus 1 includes an illumination unit 2, an imprint head 4 for holding a mold 3, a substrate stage 6 that can move while supporting a substrate 5, a dispenser 7 that supplies an imprint material 10, and a controller 8. The illumination unit 2, the imprint head 4, and the dispenser 7 are supported by a structure 12.

The illumination unit 2 irradiates the mold 3 with ultraviolet light at the time of an imprint process. The illumination unit 2 includes a light source 20 and an illumination optical system 21 configured to adjust the ultraviolet light emitted from the light source 20 into light suitable for the imprint process. For example, a halogen lamp that generates ultraviolet light can be used as the light source 20. The illumination optical system 21 can include an optical element such as a lens, an aperture (opening), a shutter for switching between irradiation and light shielding, and the like (all of which are not shown).

The mold 3 has, for example, an approximately rectangular outer shape and includes the mesa portion 22 in which a predetermined pattern (for example, a concave-convex pattern such as a circuit pattern) has been formed three-dimensionally. Note that the surface of the concave-convex pattern is processed to have high flatness to maintain adhesion with the surface of the substrate 5. The material of the mold 3 can be a material, such as silica glass, capable of transmitting ultraviolet light.

The imprint head 4 functions as a mold holder that moves while holding the mold 3. The imprint head 4 can include a shape correction mechanism 4a (magnification correction mechanism), a mold chuck 4b that draws and holds the mold 3 by a suction force or an electrostatic force, and a mold driving mechanism 4c that drives the mold chuck 4b (that is, the mold 3). The shape correction mechanism 4a includes a plurality of fingers installed so as to face each other with respect to regions on the side surfaces of the periphery of the mold 3 and corrects a pattern formed on the mold 3 to a target shape by applying a compressive force to the mold 3 by driving these fingers. Note that the configuration of the shape correction mechanism 4a is not limited to this, and the shape correction mechanism may be configured, for example, to apply a tensile force to the mold 3.

The mold driving mechanism 4c is a driving system that drives the mold chuck 4b in a Z-axis direction in order to bring the mold 3 into contact with the imprint material 10 supplied onto the substrate 5. The mold driving mechanism 4c may also have an adjustment function of adjusting the position of the mold 3 in X and Y directions or a θ direction (a rotational direction about the Z-axis) and a tilt function of adjusting the tilt of the mold 3. An actuator to be adopted for this mold driving mechanism 4c is not particularly limited, and it is possible to adopt a linear motor, an air cylinder, or the like as the actuator.

Each of the substrate stage 6 and a substrate chuck 25 functions as a substrate holder that moves while holding the substrate. The substrate chuck 25 is fixed onto the substrate stage 6. Many holes are provided in the upper surface of the substrate chuck 25. A suction pressure adjustment mechanism 6b (for example, a vacuum device) is connected to these holes and is configured to exhaust a gas on the upper surface of the substrate chuck 25 through the holes. The substrate 5 is arranged so that its lower surface will contact the upper surface of the substrate chuck 25, and the substrate 5 is chucked and held by the substrate chuck 25 by causing the vacuum device to exhaust the gas present between the lower surface of the substrate 5 and the upper surface of the substrate chuck 25.

The imprint apparatus 1 includes a substrate driving mechanism 6a that drives (positions) the substrate stage 6 (that is, the substrate 5) in the X and Y directions on a platen 32. A measurement device 31 can measure the position of the substrate stage 6 in the X and Y directions. The substrate driving mechanism 6a may further have an adjustment function of adjusting a position in the Z-axis direction and a position in the θ direction (the rotational direction about the Z-axis), and a tilt function of adjusting the tilt of the substrate 5.

The measurement device 31 can be, for example, an interferometer supported by the structure 12. The measurement device 31 measures the position of the substrate stage 6 by, for example, irradiating the substrate chuck 25 with measurement light and detecting the measurement light reflected by a measurement mirror 30 provided on the end face of the substrate chuck 25. Note that although only one measurement device 31 is shown in FIG. 1, a number of measurement devices 31 capable of measuring at least the X and Y positions, rotation amount, and a tilt amount of the substrate stage 6 can be included.

The imprint apparatus 1 can obtain positional deviation information by observing an alignment mark formed on the substrate 5 or the substrate chuck 25 by an alignment optical system (not shown). The imprint apparatus 1 can measure the distance to the upper surface of the substrate 5 by a height measurement device 29. Since the relative heights of the pattern surface of the mold 3 and a height measurement device 15 are measured in advance, the distance from the upper surface of the substrate 5 to the pattern surface of the mold 3 can be obtained by calculation.

The dispenser 7 supplies the imprint material 10 onto the substrate 5. Subsequently, when the mold driving mechanism 4c moves the mold 3 downward and brings it into contact with the imprint material 10 on the substrate 5, the imprint material 10 flows into each groove engraved into a pattern. The ultraviolet light emitted from the light source 20 passes through the mold 3 via the illumination optical system 21 and enters the imprint material 10 on the substrate 5. The imprint material 10 irradiated with the ultraviolet light is thus cured. An inverted pattern of the pattern of the mold 3 is formed by the cured imprint material. After the imprint material 10 is cured, a gap between the mold 3 and the substrate 5 is widened by causing the mold driving mechanism 4c to move the mold 3 upward, and thus the mold 3 is separated from the cured imprint material 10 (mold separation).

Note that the imprint apparatus 1 according this embodiment adopts an arrangement in which the imprint head 4 is driven and brought into contact with the imprint material on the fixed substrate 5. However, an arrangement opposite to this arrangement can be adopted. That is, an arrangement in which the substrate stage 6 is driven to bring the imprint material on the substrate 5 into contact with the fixed mold 3 may be adopted. Alternatively, the imprint apparatus may adopt an arrangement in which the imprint head 4 and the substrate stage 6 are driven vertically. That is, the imprint apparatus suffices to have an arrangement that can change the gap between the mold 3 and the substrate 5 relatively.

The controller 8 includes, for example, a CPU 8a, a memory 8b, and the like and generally controls the units of the imprint apparatus 1.

Figure 3A:
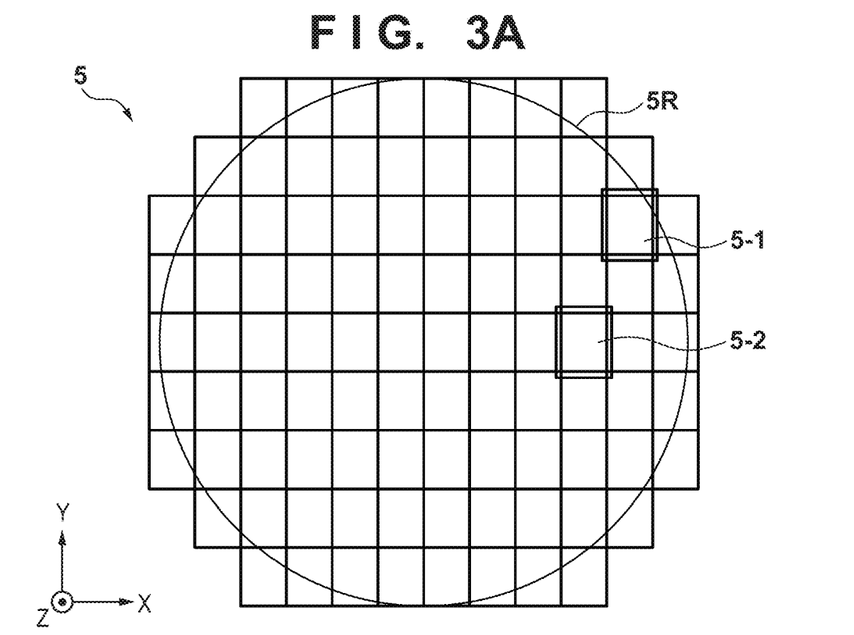
FIG. 3A is a view showing an example of the layout of a shot region on a substrate.

FIG. 3A is a view showing an example of the layout of a shot region on the substrate 5. In this embodiment, in order to maximize an effective area (an area of a pattern transfer region) of the substrate 5, an imprint process is performed on not only each interior shot region 5-2 of the substrate 5 but also on each peripheral shot region 5-1 including a periphery 5R of the substrate 5. Assume that, other than a so-called "partial shot region" which protrudes from the periphery 5R of the substrate 5, a peripheral shot region includes each shot region at the most exterior position along the radial direction of the substrate 5 even if the shot region does not protrude from the periphery 5R.

Figure 2A:
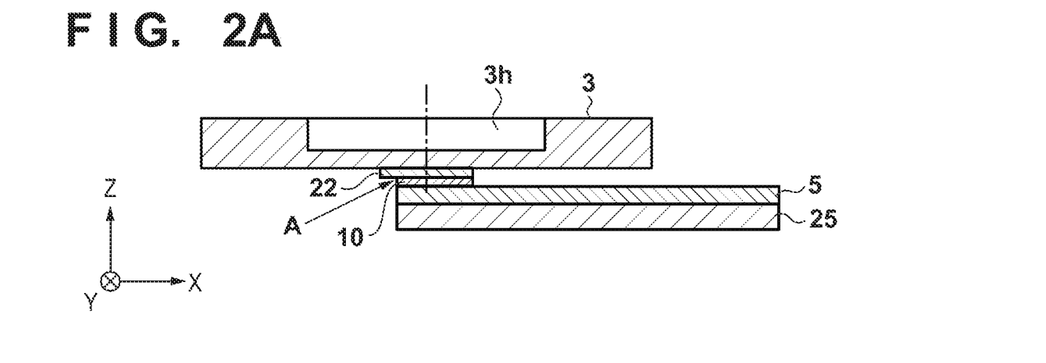
FIG. 2A is a view for explaining a mold separation operation by the imprint apparatus according to the embodiment.
Figure 2B:
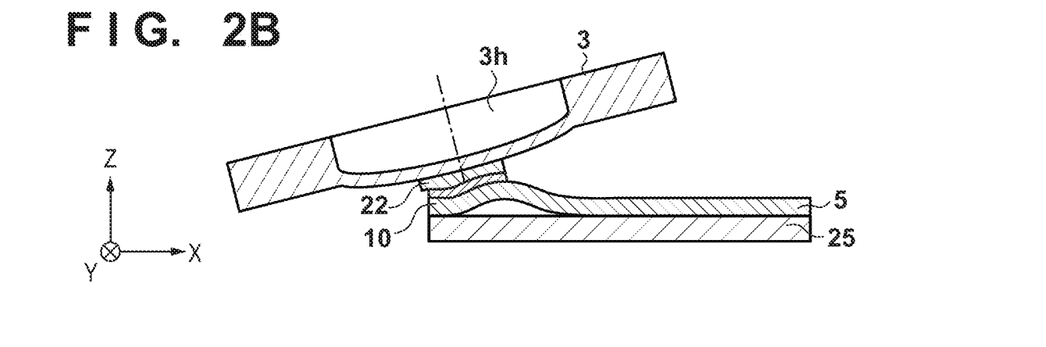
FIG. 2B is a view for explaining the mold separation operation by the imprint apparatus according to the embodiment.
Figure 2C:
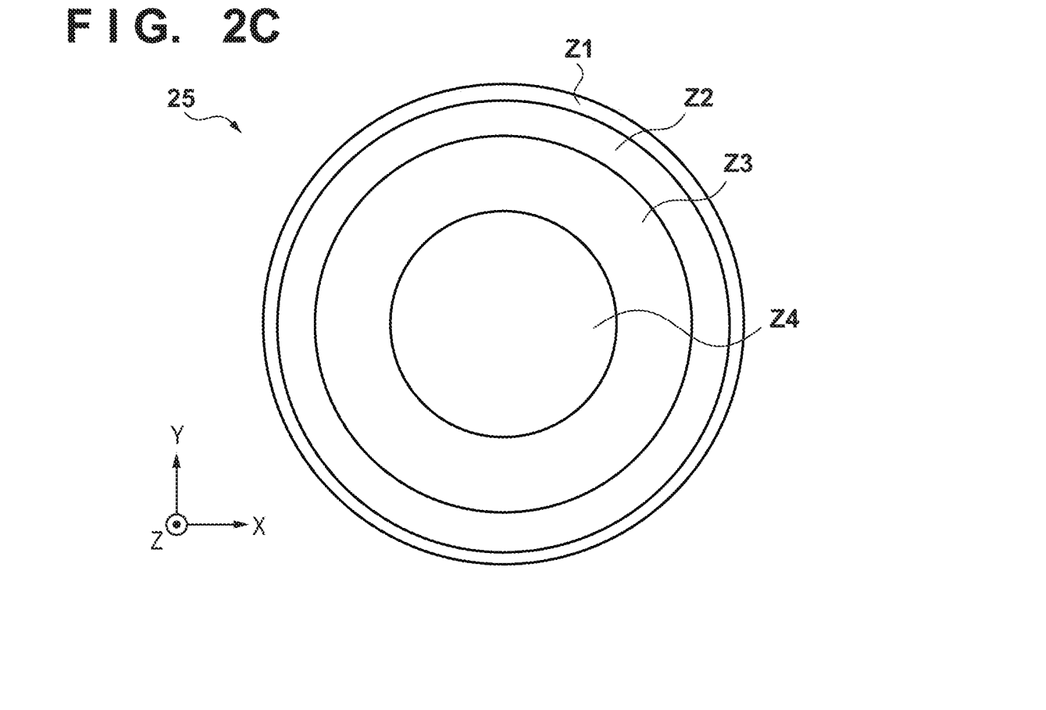
FIG. 2C is a plan view of a substrate chuck according to the embodiment.

An operation performed at mold separation performed by the imprint apparatus 1 according to this embodiment will be described below with reference to FIGS. 2A to 2C. FIGS. 2A and 2B each show an operation performed at mold separation in an imprint process on the peripheral shot region 5-1. FIG. 2C shows a view in which the substrate chuck 25 is viewed from the side of the mold 3. A plurality of suction regions Z1, Z2, Z3, and Z4 are concentrically formed on the surface, of the substrate chuck 25, which is to be brought into contact with the lower surface of the substrate 5. Note that the number of the suction regions is not limited to 4, and a fewer or greater number of suction regions than this may be arranged. Each of the plurality of suction regions Z1, Z2, Z3, and Z4 is connected to the suction pressure adjustment mechanism 6b, thereby allowing the suction forces of the respective suction regions to be controlled independently.

A pattern corresponding to one shot region of the substrate 5 is formed on the mesa portion 22 of the mold 3. In the mold 3 according to this embodiment, the region where the mesa portion 22 is formed is thinner than other peripheral portions, and a cored-out portion 3h which is a sealed space is formed between the upper portion of the mold 3 and the mold chuck 4b. The pressure of the cored-out portion 3h can be controlled by a pressure adjustment unit (not shown) under the control of the controller 8. Since the region where the mesa portion 22 is formed has been made thinner than the other peripheral portions, it is deformed when the pressure of the cored-out portion 3h is adjusted. The pressure adjustment unit can adjust the pressure of a gas or fluid in the cored-out portion 3h.

When the mesa portion 22 of the mold 3 is to be brought into contact with the imprint material 10 supplied on a shot region of the substrate 5, the pressure adjustment unit increases the pressure in the cored-out portion 3h to deform the mold 3 into a convex shape toward the substrate 5. Subsequently, the mold 3 is brought closer to the substrate 5 by the mold driving mechanism 4c, and the mold 3 is restored to a planar shape by decreasing the pressure in the cored-out portion 3h in accordance with the mesa portion 22 contacting the imprint material 10 on the substrate 5. This causes the gas between the mold 3 and the imprint material 10 to be sequentially pushed outside, thereby preventing a bubble from mixing into the gap between the mold 3 and the imprint material 10. Subsequently, the light source 20 irradiates the imprint material 10 on the substrate 5 with ultraviolet light, and the imprint material 10 is cured. This state is shown in FIG. 2A.

Subsequently, the mold driving mechanism 4c executes mold separation to separate the cured imprint material 10 from the mold 3. At this time, if the force generated by the separation of the mold 3 exceeds the suction force of the substrate chuck 25, it can cause the edge of the substrate 5 to rise from the substrate chuck 25, and the mold 3 will not be able to be separated normally. Therefore, in this embodiment, the controller 8 will weaken the suction force of a suction region (for example, the suction region Z2) at the position where the mold 3 is to be separated from the imprint material 10. The controller will not, however, weaken the suction force of a suction region (for example, the suction region Z1) at a position on the substrate peripheral side than the position where the mold is to be separated. As shown in FIG. 2B, weakening the suction force of the suction region at the position where the mold 3 is to be separated from the imprint material 10 will cause a portion near the separation position of the substrate 5 to rise from the substrate chuck 25. This can reduce the stress generated in the interface between the mold 3 and the imprint material 10, and reduce the defects caused by pattern distortion as a result. On the other hand, by not weakening the suction force of each suction region at a position on the substrate peripheral side than the separation position, it becomes possible to prevent the substrate holding force from weakening due to the formation of a gap between the substrate 5 and the substrate chuck 25 in the substrate peripheral portion.

In addition, as shown in FIG. 2B, the controller 8 will control the mold driving mechanism 4c to perform mold separation by tilting the imprint head 4 (that is, the mold 3) toward the substrate peripheral side. At this time, for example, the controller 8 will tilt the mold 3 with respect to a position A, which is on the periphery of the substrate on the mesa portion 22, as a fulcrum.

According to the embodiment described above, in each shot region near the periphery of the substrate, the substrate 5 is suppressed from rising from the substrate chuck 25 at the time of mold separation. In addition, the stress generated in the interface between the mold 3 and the imprint material 10 at the time of mold separation is reduced, and it becomes possible to reduce the defects caused by pattern distortion.

Figure 3B:
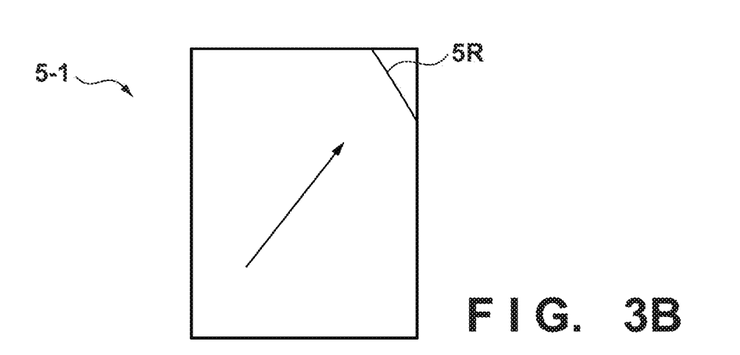
FIG. 3B is a view for explaining a direction in which a mold is to be tilted at mold separation.
Figure 3C:
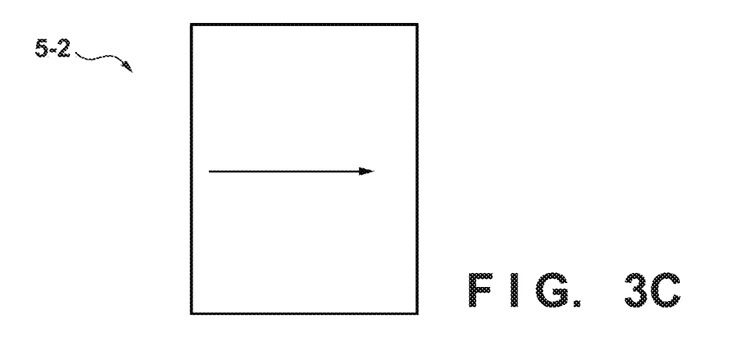
FIG. 3C is a view for explaining a direction in which the mold is to be tilted at mold separation.

The direction in which the mold 3 is to be tilted will be described. In the case of the peripheral shot region 5-1, for example, a direction taken along a line connecting the center of the substrate 5 and the center of the peripheral shot region 5-1 as indicated by an arrow shown in FIG. 3B is set as the tilt direction of the mold 3. That is, the controller 8 will tilt the imprint head 4 to the peripheral side of the substrate 5 in a direction from the center of the substrate 5 toward the center of the peripheral shot region 5-1. In the case of the substrate interior side shot region 5-2, it may be arranged so that the mold 3 will not be tilted. However, it may be also arranged so that the imprint head 4 will be tilted in a direction from the center of the substrate 5 toward the center of the shot region 5-2, as shown in FIG. 3C, even in the case of the substrate interior side shot region 5-2.

The tilt amount of the mold 3 will be described. The possibility that a gap will form between the substrate 5 and the substrate chuck 25 in the substrate peripheral portion at the time of mold separation decreases as closer the shot region is to the substrate interior side. In contrast, the possibility that a gap will form between the substrate 5 and the substrate chuck 25 in the substrate peripheral portion at the time of mold separation increases when the shot region is a peripheral shot region or the shot region is closer to the periphery of the substrate even if the shot region is not a peripheral shot region. Hence, it may be arranged so the tilt amount of the imprint head 4 at the time of mold separation will be increased when the shot region is closer to the substrate peripheral side.

However, there is a need to prevent the mold 3 from interfering with a peripheral region when the imprint head 4 is tilted. More specifically, in the case of the substrate interior side shot region 5-2, the tilt amount of the mold 3 needs to be restricted to an amount that will not cause the shot region to interfere with an adjacent shot region. In addition, a flush plate 25b that serves as an auxiliary plate to minimize the step between the substrate 5 and its periphery 5R is arranged in the peripheral portion of the substrate chuck 25 of the imprint apparatus 1. For the purpose of improving the filling property of the imprint material 10, a gas supply unit (not shown) can supply a gas such as helium or the like to the space between the mold 3 and the substrate 5 onto which the imprint material 10 has been supplied. The flush plate 25b is provided to make the concentration of gas uniform in the overall range of the substrate. Hence, the tilt amount of the mold 3 needs to be restricted to an amount which will prevent the mold 3 from interfering with the flush plate 25b in also the case of the peripheral shot region 5-1. However, since the flush plate 25b generally tends to be set at a height that is slightly lower than that of the substrate 5, the tilt amount of the mold 3 may be set to be smaller for the shot region 5-2 than that of the peripheral shot region 5-1.

Figure 4A:
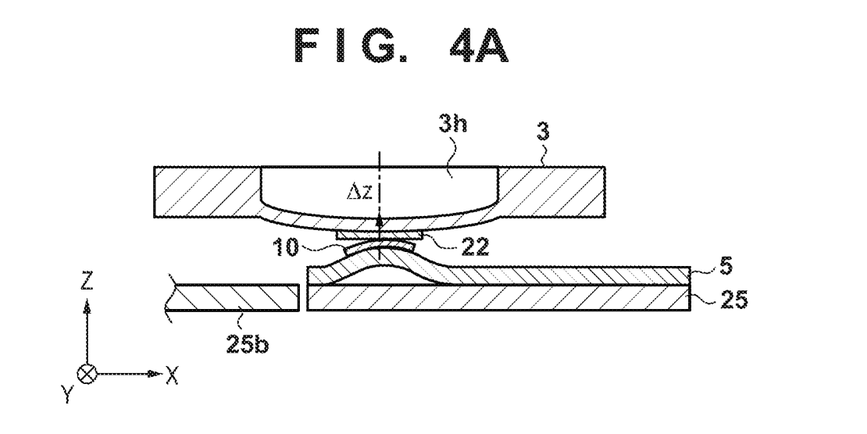
FIG. 4A is a view for explaining the mold separation operation by the imprint apparatus according to the embodiment.
Figure 4B:
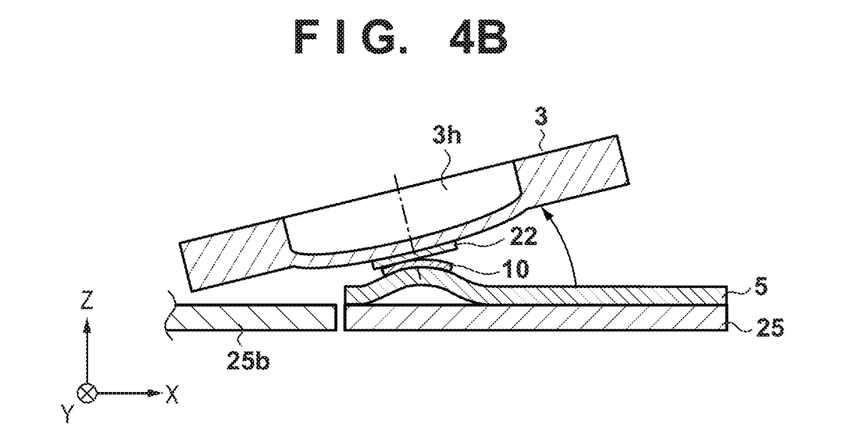
FIG. 4B is a view for explaining the mold separation operation by the imprint apparatus according to the embodiment.

Additionally, as shown in FIG. 4A, in this embodiment, the controller 8 will first start the mold separation operation without tilting the mold 3 and move at least one of the imprint head 4 and the substrate stage 6 by a predetermined amount so as to separate the mold 3 and the substrate 5. For example, the imprint head 4 will be driven here in the +Z direction by a predetermined amount. At this time, as described above, the substrate 5 can be partially raised without causing the periphery 5R to separate from the substrate chuck 25 by weakening the suction force of the suction region Z2 while maintaining a strong suction force in the suction region Z1 below the periphery 5R of the substrate 5. After the imprint head 4 has been driven in the +Z direction for the predetermined amount, the controller 8 tilts the imprint head 4 (that is, the mold 3) as shown in FIG. 4B. By performing control to tilt the mold 3 after moving the mold 3 in the +Z direction by a predetermined amount in this manner, it becomes possible to ensure an effective tilt amount for the mold 3 while avoiding interference with the flush plate 25b or the substrate 5.

The amount by which the mold 3 will be driven in the Z-axis direction without tilting and the tilt direction and amount of the mold 3 can be determined in advance depending on the position of the shot region. Thus, in this embodiment, a table of information defining the amount by which the mold 3 will be driven in the Z-axis direction without tilting and the tilt direction and amount of the mold 3 will be stored in advance in the memory 8b of the controller 8. The suction force of each suction region can also be determined depending on the position of the shot region. Hence, the suction force of each suction region for each shot region may be further defined in the table. At the execution of the imprint process, the controller 8 can control the amount by which the mold 3 will be driven in the Z-axis direction without tilting, the tilt direction and amount of the mold 3, and the suction forces of the respective suction regions by reading out this table from the memory 8b and referring to this table.

Note that although the imprint head 4 was tilted in the above-described example, the same effect can be obtained by tilting the substrate stage 6. Hence, it is sufficient to have an arrangement in which at least one of the imprint head 4 and the substrate stage 6 will be tilted.

In addition, the controller 8 may return the imprint head 4 to its original non-tilted state after the imprint head 4 has been tilted at the time of mold separation. This can further ensure that the interference between the mold 3 and the substrate 5 or the flush plate 25b will be avoided.

Additionally, at this time, the mold 3 may be warped toward the −Z direction by a mold separation force or the pressure adjustment unit may increase the pressure in the cored-out portion 3h to deform the mold 3 into a convex shape toward the substrate 5 as described above. By increasing the pressure in the cored-out portion 3h to deform the mold 3 into a convex shape toward the substrate 5, it becomes possible to suppress the periphery 5R of the substrate 5 from rising from the substrate chuck 25.

In this manner, according to this embodiment, mold separation is performed by combining the pressurization of the cored-out portion 3h, the movement of the mold 3 in the Z direction, and the tilt driving of the mold 3 to the peripheral side of the substrate 5. This can prevent the substrate 5 from falling off from the substrate chuck 25 at mold separation and reduce the stress generated in the interface between the mold 3 and the imprint material 10 at the mold separation, and thus defects due to pattern distortion can be reduced.

Figure 5A:
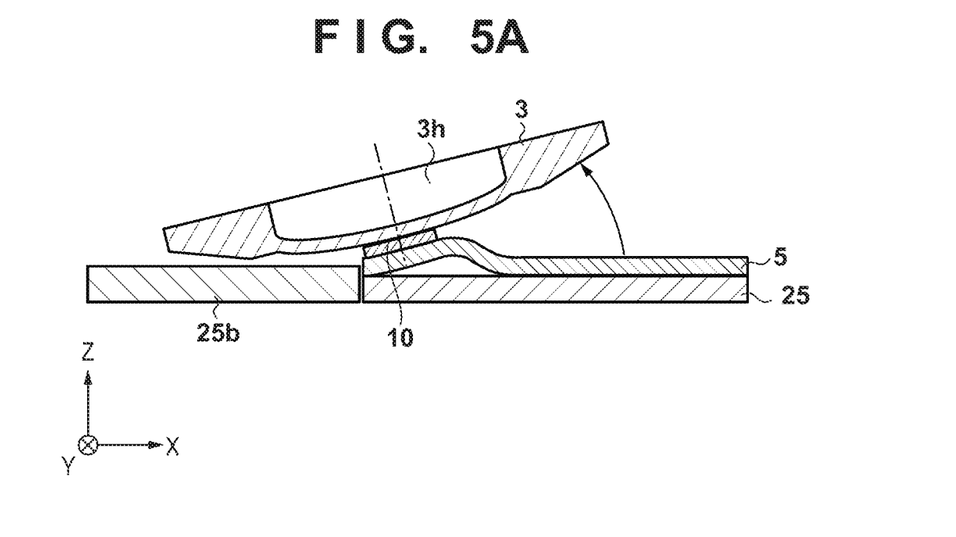
FIG. 5A is a view showing an example of the shape of the mold according to the embodiment.
Figure 5B:
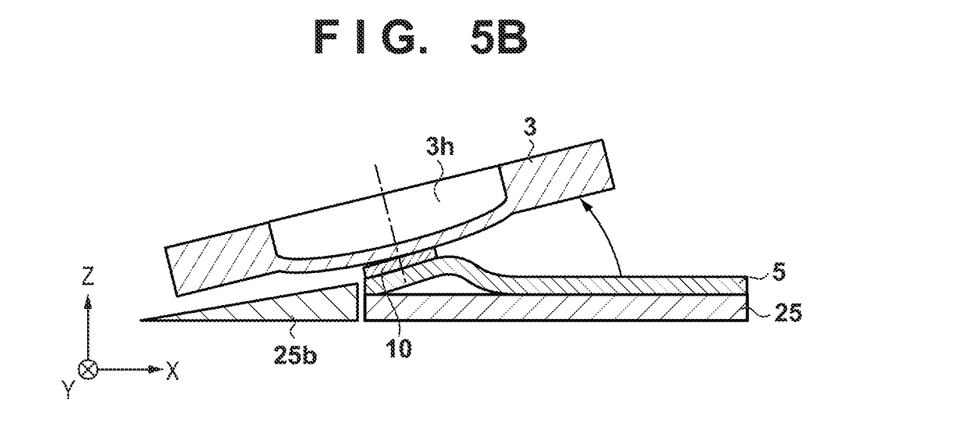
FIG. 5B is a view showing an example of the shape of a flush plate according to the embodiment.

In addition, in order to avoid the interference between the mold 3 and the substrate 5 or the flush plate 25b, the surface of the mold 3 which faces the peripheral portion of the substrate can be processed, as shown as in FIG. 5A, so as to include a upward slope toward the peripheral side. Alternatively, as shown as in FIG. 5B, the flush plate 25b may include a downward slope toward the peripheral side. Alternatively, it may be arranged so that the surface of the mold 3 which faces the peripheral portion of the substrate will include an upward slope toward the peripheral side and the flush plate 25b will include a downward slope toward the peripheral side.

Figure 6:
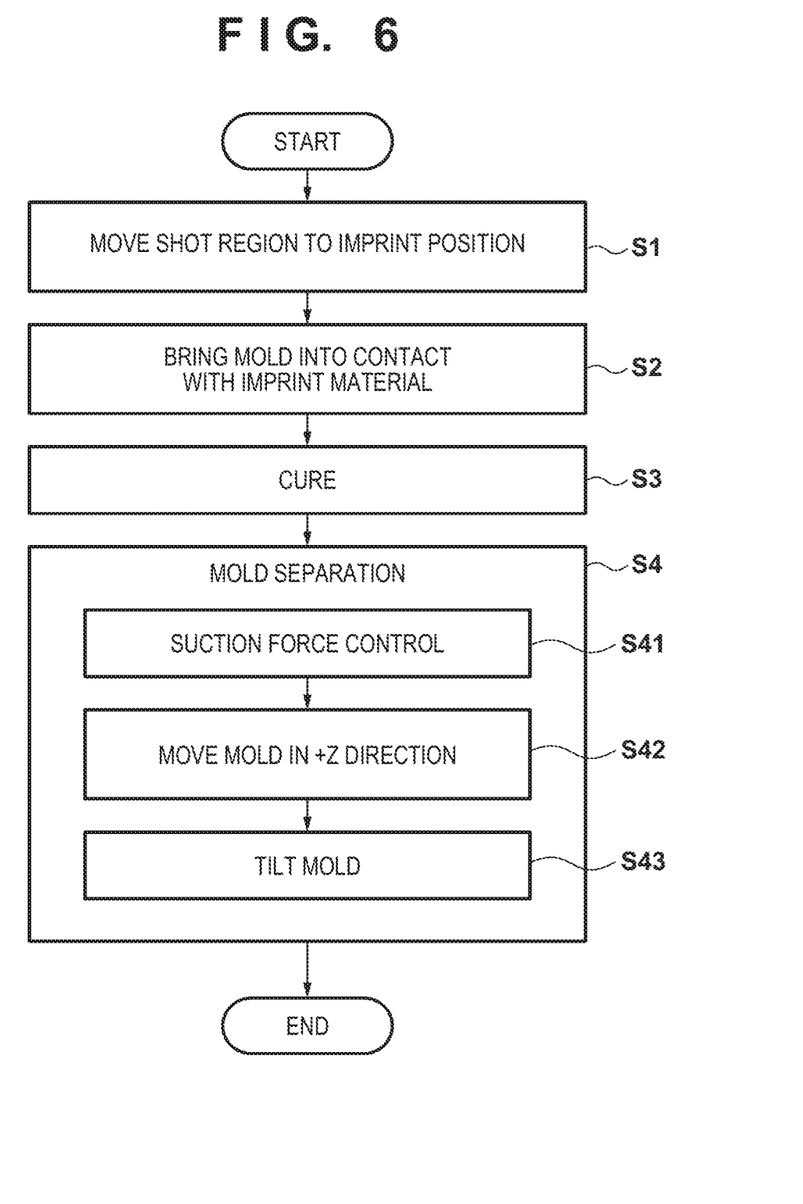
FIG. 6 is a flowchart showing an example of the procedure of an imprint process according to the embodiment.

The procedure of an imprint method according to this embodiment will be described with reference to FIG. 6. In step S1, the controller 8 controls the substrate driving mechanism 6a to position the substrate 5 so that a shot region of the substrate 5 will be arranged at an imprint position. Here, an imprint position is a position where an imprint process will be executed, in other words, a position below the mold 3. In step S2, the controller 8 controls the mold driving mechanism 4c to bring (the mesa portion 22 of) the mold 3 into contact with the imprint material 10 on the shot region of the substrate 5. In step S3, the controller 8 controls the illumination unit 2 to cure the imprint material 10 on the shot region. In step S4, the controller 8 controls the mold driving mechanism 4c to perform mold separation.

In this embodiment, the mold separation process of step S4 can include the following processes. Step S41 is a suction force control process. In step S41, the controller 8 controls the suction pressure adjustment mechanism 6b to make, among the plurality of suction regions Z1, Z2, Z3, and Z4, the suction force of a suction region at a position where the mold 3 is to be separated from the imprint material 10 weaker than that of a suction region on the substrate peripheral side than the position where the mold is to be separated. In particular, the suction force of the most peripheral suction region Z1 will not be weakened. Step S42 is the movement process. In step S42, the controller 8 controls the mold driving mechanism 4c to move the mold 3 by a predetermined amount so as to separate the mold 3 and the substrate 5. Next, in step S43, the controller 8 controls the mold driving mechanism 4c to tilt the mold 3.

<Embodiment of Article Manufacturing Method>

The pattern of a cured product formed using an imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 8:
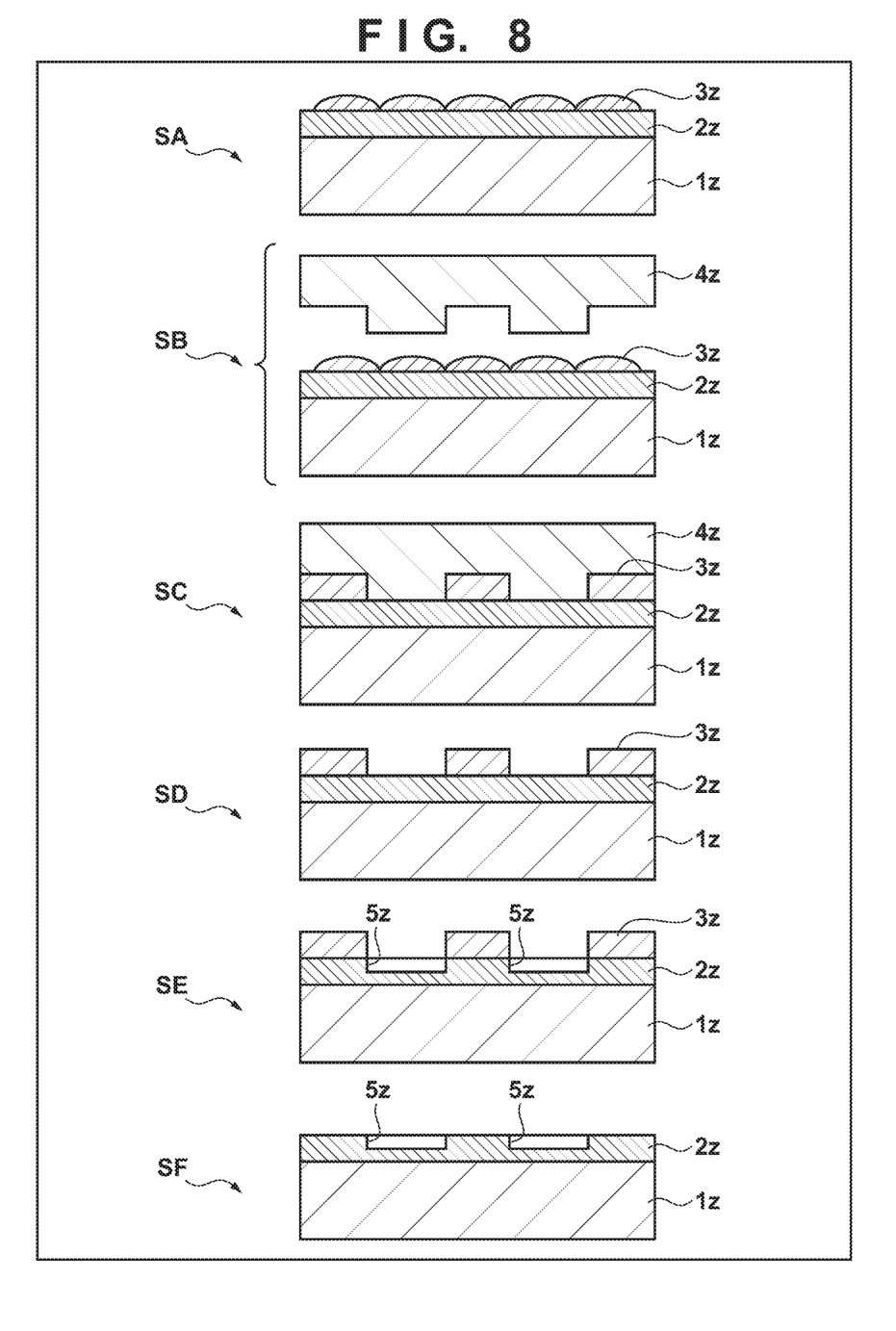
FIG. 8 is a view for explaining an article manufacturing method according to the embodiment.

An article manufacturing method will be described next with reference to FIG. 8. In step SA, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

In step SB, a side of a mold 4z for imprint with a convex-concave pattern is directed to and caused to face the imprint material 3z on the substrate. In step SC, the substrate 1 to which the imprint material 3z is applied is brought into contact with the mold 4z, and a pressure is applied. The gap between the mold 4z and the processed material 2z is filled with the imprint material 3z. The imprint material 3z is cured when it is irradiated with energy for curing via the mold 4z in this state.

In step SD, after the imprint material 3z is cured, the mold 4z is separated from the substrate 1z. Then, the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the concave-convex pattern of the mold 4z has been transferred to the imprint material 3z.

In step SE, when etching is performed using the pattern of the cured product as an etching resistant mold, a portion of the surface of the processed material 2z where the cured product does not exist or remains thin is removed to form a groove 5z. In step SF, when the pattern of the cured product is removed, an article with the grooves 5z formed in the surface of the processed material 2z can be obtained. Here, the pattern of the cured product is removed. However, instead of processing or removing the pattern of the cured product, it may be used as, for example, an interlayer dielectric film included in a semiconductor element or the like, that is, a constituent member of an article.

According to the present invention, a technique advantageous in suppressing pattern distortion and defects and preventing a substrate from falling off from a substrate holder can be provided.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-Ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An apparatus that cures an uncured material in a state where the uncured material on a substrate and a mold have been brought into contact, and performs mold separation of separating the mold from the cured material, comprising:
    a mold holder configured to move while holding the mold;
    a substrate holder including a plurality of suction regions for chucking a lower surface of the substrate and configured to move while holding the substrate; and
    a controller configured to control the mold holder and the substrate holder during the mold separation,
    wherein in a state where, among the plurality of suction regions, a suction force of a second suction region, which is on a peripheral side of the substrate with respect to a first suction region for sucking a region of the lower surface of the substrate corresponding to a portion of the cured material on the substrate, is larger than a suction force of the first suction region,
    the controller is configured to:
    cause at least one of the mold holder and the substrate holder to be moved to widen a gap between the mold and the substrate,
    cause the mold holder and the substrate holder to be relatively tilted after the movement, and
    cause the at least one of the mold holder and the substrate to be moved to perform the mold separation in a state where the mold holder and the substrate holder are relatively tilted.

2. The apparatus according to claim 1, wherein the controller is configured to cause the mold holder to be tilted so that the mold held by the mold holder is lowered from the center of the substrate toward the center of a region of the substrate corresponding to the portion on which the cured material is placed.

3. The apparatus according to claim 1, wherein the substrate has a plurality of shot regions that are sequentially imprinted using the mold and the uncured material, and
    the controller is configured to control the tilt of the mold holder based on information on a direction and an amount of tilting the mold holder for each shot region.

4. The apparatus according to claim 1, wherein the controller is configured to control the mold holder to return the mold holder to a relatively non-tilted state after the mold is separated from the cured material in the state where the mold holder has been relatively tilted.

5. The apparatus according to claim 1, wherein the controller is configured to control the mold holder so that the mold is deformed into a convex shape toward the substrate when the mold separation is performed.

6. The apparatus according to claim 1, further comprising:
    an auxiliary plate arranged along a peripheral portion of the substrate,
    wherein the auxiliary plate includes a downward slope toward the peripheral side.

7. An article manufacturing method for manufacturing an article, comprising:
    forming a pattern on a substrate by the apparatus defined in claim 1; and
    processing the substrate on which the pattern has been formed,
    wherein the article is manufactured from the processed article.

8. The apparatus according to claim 1, wherein the second suction region sucks a region of the lower surface of the substrate corresponding to a portion of the cured material on the substrate.

9. The apparatus according to claim 1, wherein the second suction region sucks a region of the lower surface of the substrate, which is on a peripheral side of the substrate with respect to a region of the lower surface of the substrate corresponding to a portion of the cured material on the substrate.

10. The apparatus according to claim 1, wherein the material is an imprint material.

11. The apparatus according to claim 1, wherein the material is a composition having property of being cured by being irradiated with light.

12. The apparatus according to claim 1, the uncured material on a shot region including an outer periphery of the substrate is cured in a state where the uncured material and the mold are in contact with each other.

13. A method, comprising:
    bringing a mold held by a mold holder and an uncured material on a substrate held by a substrate holder into contact with each other;
    curing the uncured material after the contacting; and
    separating the mold from the cured material after the curing,
    wherein in the separating comprises
    causing, among a plurality of suction regions configured to chuck a lower surface of the substrate arranged on the substrate holder, a suction force of a second suction region, which is on a peripheral side of the substrate with respect to a first suction region for sucking a region of the lower surface of the substrate corresponding to a portion of the cured material on the substrate, larger than a suction force of the first suction region, and
    moving at least one of the mold holder and the substrate holder so as to widen a gap between the mold and the substrate,
    causing the mold holder and the substrate holder to be relatively tilted after the moving, and
    causing the at least one of the mold holder and the substrate to be moved to perform the separating in a state where the mold holder and the substrate holder are relatively tilted.

14. An article manufacturing method for manufacturing an article, comprising:
    forming a pattern on a substrate by the method defined in claim 13; and
    processing the substrate on which the pattern has been formed,
    wherein the article is manufactured from the processed substrate.

* * * * *